Dec. 8, 1970 MASAHIRO OMORI 3,546,624

ELECTRONICALLY TUNED SOLID STATE OSCILLATOR

Filed Nov. 22, 1968

INVENTOR.
MASAHIRO OMORI

BY Warren M Becker

ATTORNEY

United States Patent Office 3,546,624

Patented Dec. 8, 1970

3,546,624

ELECTRONICALLY TUNED SOLID STATE OSCILLATOR

Masahiro Omori, Palo Alto, Calif., assignor to Varian Associates, Palo Alto, Calif., a corporation of California Filed Nov. 22, 1968, Ser. No. 778,112
Int. Cl. H03b *7/14*
U.S. Cl. 331—107 5 Claims

ABSTRACT OF THE DISCLOSURE

The use of thin conductive strips of rectangular cross-section for the input and output loops of Gunn microwave oscillators and in particular, electrically floating the output loop has resulted in achieving substantially uniform output power levels over a wide frequency range, as 8–14 gHz.

DESCRIPTION OF PRIOR ART

The present invention relates in general to microwave oscillators, and more particularly, to a broadband YIG tuned Gunn oscillator with improved input and output coupling loops.

Gunn diodes produce microwave signals in the gigaHertz frequency range. The fundamental frequency of any given diode is primarily related to the physical size, that is, the length of the semiconductive chip used as the active element. In a resonant cavity or when coupled to a tunable resonator, such as a YIG sphere or other ferrimagnetic material, the frequency of the output signal from the diodes can be controlled and the signal made available for use by external devices. Due to the ease and rapidity of electronic tuning, the YIG resonator appears to be quite practical especially in light of the relatively limited frequency range available with conventional mechanically tuned resonant circuits.

Conventional YIG tuned oscillators, however, have been limited in operation to the lower frequencies in the gigaHertz frequency range and have been found to exhibit severe nonuniform output power levels over any given range due to spurious or parasitic resonances.

SUMMARY OF THE PRESENT INVENTION

Accordingly, a primary object of the present invention is a microwave oscillator for producing microwave signals in higher freqency ranges.

Another object of the invention is a microwave oscillator which produces microwave signals over an extended range of frequencies with substantially uniform power levels, that is, output signals substantially free of spurious or parasitic resonances.

One feature of the present invention in accordance with the aforementioned objects is an input coupling loop for coupling energy from the Gunn diode to the YIG sphere comprising a thin conductive strip grounded at one end.

Another feature of the present invention is an output loop comprising a thin conductive strip which is separated from the input loop by the YIG sphere and electrically floated relative to the surrounding ground plane.

Other objects and features of the invention will become apparent in the detailed description where read in connection with the accompanying drawings in which:

DESCRIPTION OF THE PREFERRED EMBODIMENTS

The frequency of an output signal of an electronically tuned Gunn oscillator is controlled by controlling the magnetic dipole precession frequency of a ferrimagnetic resonator, such as a YIG sphere, in accordance with the linear equation $$f=\gamma H$$

where $f$ is the frequency of precession, $\gamma$ is a constant and H is the intensity of the ambient magnetic field. Microwave energy from a Gunn diode is coupled into the YIG by an input loop and provided to external circuits from the YIG by an output loop. In the absence of the YIG, no signal is seen in the output loop due to the orthogonal relationship between the input and output loops and the Gunn diode outputs a signal of fundamental frequency determined by its physical geometry. With the YIG in the circuit and a magnetic field of appropriate intensity in accordance with the above equation, an output signal will appear with a frequency substantially equal to the frequency of precession of the YIG.

In practice, a change in magnetic field intensity results in a change in the frequency of precession of the YIG which is reflected back to the diode causing the diode to oscillate at a new frequency to maintain the precession signal. In this manner, a single Gunn diode has been controlled to provide usable output signals over a range of frequencies from 8–14 gHz.

Figure 1:
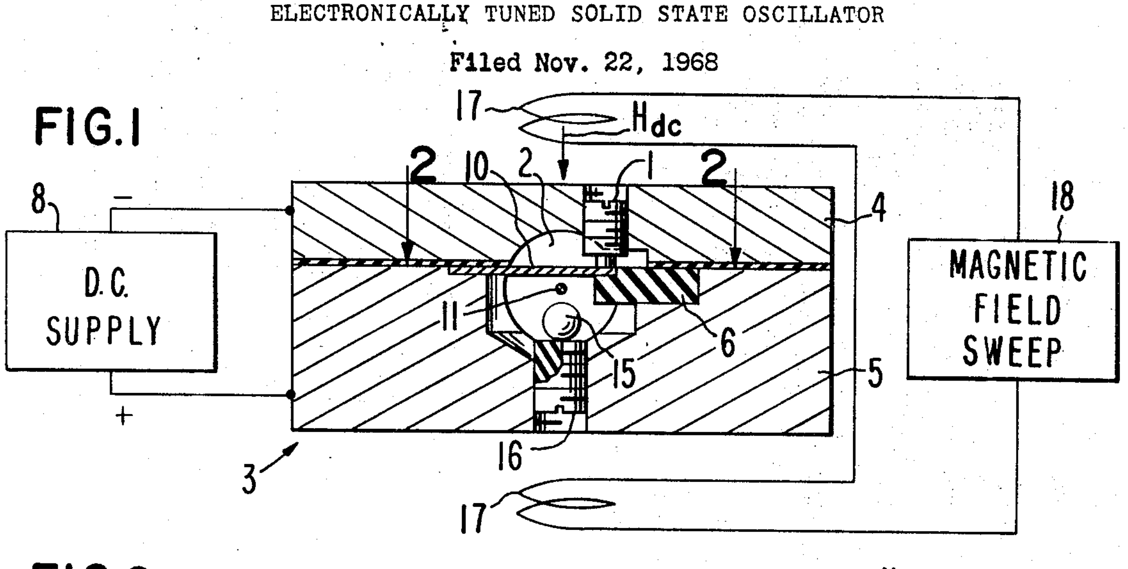
FIG. 1 is a fragmentary view of one embodiment of the present invention.
Figure 2:
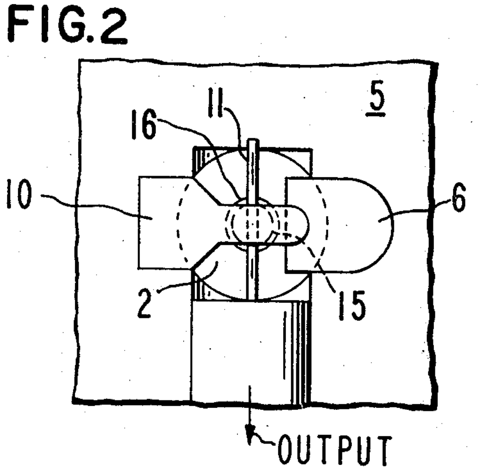
FIG. 2 is a fragmentary view taken in the direction of lines 2—2 in FIG. 1.

Referring to FIGS. 1 and 2, there is shown one embodiment of a YIG tuned Gunn oscillator in accordance with the present invention. A block 3 of conductive material such as copper is provided in two sections, an upper section 4 and a lower section 5. Sections 4 and 5 are insulated from each other, as by a thin film of Mylar or anodized aluminum, for providing a means for applying the necessary D.C. bias across the diode. A portion of each of sections 4 and 5 is removed to form a cavity 2 within which the oscillator elements are located. Block 3 provides mechanical support for the oscillator elements as well as providing R.F. signal paths. The dimensions of cavity 2 are kept small compared to half the wave length of the signals of interest in order to avoid the generation of cavity resonance modes. For that reason, it will be understood, the particular shape of the cavity is of minor importance in the operation of the oscillator and, it may be expected, other methods such as potting the elements in epoxy would be suitable.

Referring to FIGS. 1 and 2, a source of microwave energy is provided by a device which exhibits bulk negative conductivity, a Gunn diode 1. Gunn diode 1 is formed by mounting a chip of GaAs or other electrically similar semiconductive material on a copper screw. The copper screw functions as the cathode electrode to which, in operation, a suitable negative potential is applied as by a D.C. power supply 8 coupled between insulated sections 4 and 5.

Gunn diode 1 is threaded into upper section 4 of block 3 and makes electrical contact with an input loop 10 in the interior of cavity 2. A block 6 of insulating material such as Rexolite butts against the opposing underside of input loop 10 to insure good electrical contact. Input loop 10 is formed from a thin strip of conductive material of rectangular cross-section such as copper and extends from the anode of diode 1 across cavity 2 to make electrical contact with lower section 5 of block 3.

The starting frequency is a function of the inductance of the R.F. input loop 10 and capacitance of diode 1. To obtain as high a starting frequency as desired, the inductance of input loop 10 is made small by using a thin strip of conductive material of rectangular cross-section. As shown in FIG. 2, the strip is flaired somewhat near its grounded end and by that means, the ground plane of the walls of cavity 2 is effectively moved to the point where the edges of the flaired portions intersect the edges of the horizontal portion of the input loop 10. Alternatively, the desired reduction in inductance of input loop 10 can be achieved by reducing the size of cavity 2 and the length of input loop 10.

Immediately below input loop 10 and orthogonal to it, there is provided an output loop 11.

Below output loop 11 there is provided a ferrimagnetic resonator 15, such as a YIG sphere.

The YIG sphere 15 is mounted on a plug 16 of insulating material such as Rexolite. For controlling the magnetic dipole precession of the YIG sphere 15, a magnetic field $H_{dc}$ is further provided by a pair of series wound coils 17 on opposite sides of the YIG sphere 15. A variable power supply 18 is coupled to coils 17 and in operation is used to control the intensity of the magnetic field $H_{dc}$ to vary the frequency of the output signal.

Output loop 11 is formed from a straight wire and in practice, may be simply an extension of the center wire of a coaxial cable. Like the input loop 10, output loop 11 is also in electrical contact with the block 3.

The use of a thin strip of conductive material in lieu of the conventional wire of circular cross-section for input loop 10 has the distinct advantage of maintaining or permitting a reduction in the magnet air gap that would otherwise be enlarged due to the larger diameter wire required to meet the inductance limits for the frequencies of interest, e.g., 8–14 gHz. or higher. Locating diode 1 beneath input loop 10 will also serve to reduce the overall thickness of the oscillator and magnet air gap without affecting performance.

To avoid spurious or parasitic resonances in the output signal, the output loop coupling to the input loop can be reduced by interposing the YIG sphere and further, a reduction in coupling between the output loop and the YIG has achieved surprisingly uniform output power levels over the desired frequency range.

Figure 3:
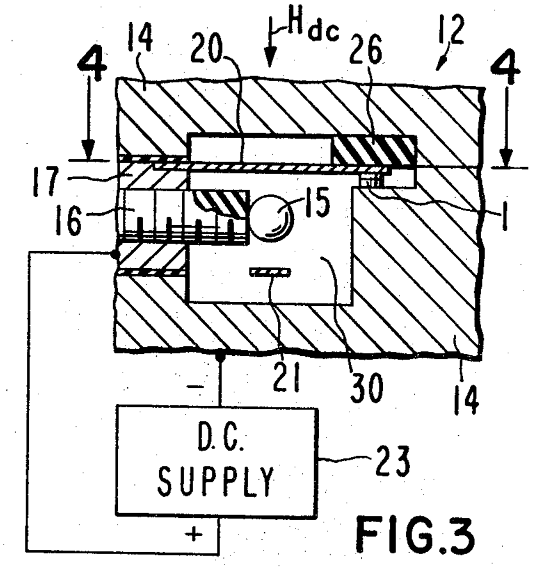
FIG. 3 is a fragmentary view of another embodiment of the present invention.
Figure 4:
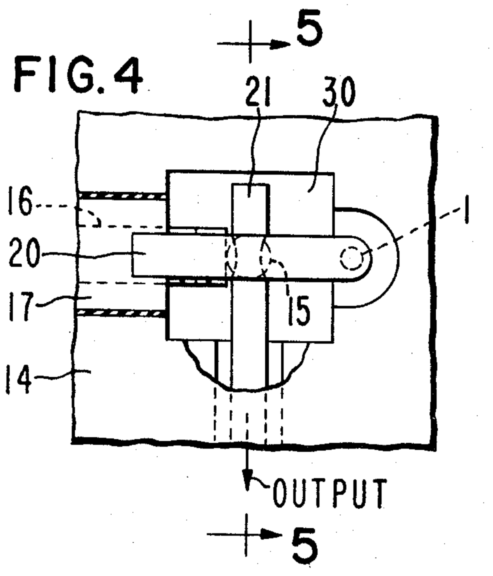
FIG. 4 is a fragmentary view taken in the direction of lines 4—4 in FIG. 3.
Figure 5:
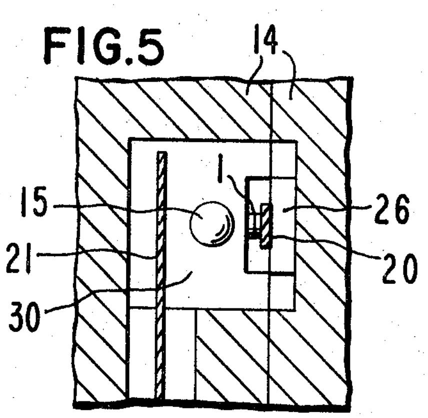
FIG. 5 is a fragmentary view taken in the direction of lines 5—5 in FIG. 4.

In FIGS. 3–5, there is shown an alternative embodiment of the present invention in which the YIG sphere 15 is interposed between the input and output coupling loops.

Referring to FIG. 3, a block 12 comprising two sections 14 electrically insulated from a section 17 forms a cavity 30 within which the oscillator elements are located. A Gunn diode 1 makes contact with the underside of an input loop 20 and a block 26 of insulating material, such as Rexolite, butts against the opposing upper surface of input loop 20 to insure good electrical contact between diode 1 and input loop 20 in the same manner as block 6 shown in FIG. 1. Input loop 20 is identical to input loop 10 but somewhat shorter. Consequently, the flaired portions of input loop 10 have been omitted from input loop 26.

An output loop 21 formed from a thin strip of conductive material of rectangular cross-section is provided orthogonal to input loop 20 and a ferrimagnetic resonator 15, such as a YIG sphere, on a plug 16 of insulating material such as Rexolite is interposed between them. The sides of output loop 21 below YIG 15 are shaped to improve field uniformity between the YIG 15 and the output loop 21. Unlike output loop 11, output loop 21 is not grounded but permitted to float electrically with respect to the surrounding ground plane formed by the walls of cavity 30. The weaker coupling between output loop 21 and YIG 15 results in improved wider tuning. A D.C. power supply 23 is coupled to insulated sections 14 and 17 for providing a suitable potential across diode 1 through input loop 20. Coils 17 (not shown in FIGS. 3–5) are also provided as described with respect to FIG. 1 for providing a magnetic field $H_{dc}$ as shown.

In operation, a typical potential, as of 8 volts, is applied across diode 1. The R.R. signal from diode 1 is coupled to YIG 15 through the input loop, and if of appropriate frequency, the YIG 15 will exhibit magnetic dipole precession. The precession induces a signal in the output loop which is then provided to external circuits. In a known manner, a magnetic field of appropriate intensity is applied simultaneously to the YIG to control the frequency of precession. As the field intensity changes, the frequency of precession changes and causes the Gunn diode to oscillate at a new frequency.

It is understood that the frequency range of 8 to 14 gHz. and the applied voltage of 8 volts is given for purposes of illustration only. For example, higher frequencies can be achieved by a decrease in the length and an increase in the width of the input loop. Higher frequencies will also require in general a reduction in applied voltage and an increase in magnetic field intensity.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. A microwave oscillator comprising:
- a source of microwave signals;
- means for producing a magnetic field;
- an input loop adapted to receive said signals;
- an output loop orthogonal to said input loop; and
- resonator means coupled to said input loop responsive to the signals in said input loop and said magnetic field for producing in said output loop an output signal the frequency of which is a function of the intensity of said magnetic field.

2. An oscillator according to claim 1 wherein said source of microwave signals comprises a device exhibiting bulk negative conductivity, said resonator is comprised of a ferrimagnetic material; and said input loop is a thin conductive strip of rectangular cross-section with one end in electrical contact with said device and the other end maintained at ground potential.

3. An oscillator according to claim 1 wherein said resonator is a YIG sphere and said output loop is a straight wire passing between said resonator and said input loop and having one end maintained at ground potential.

4. An oscillator according to claim 1 wherein said resonator is a YIG sphere and said output loop is a thin conductive strip of rectangular cross-section passing on the side of said resonator opposite said input loop and wherein the end of said output loop nearest the resonator is electrically floating relative to ground.

5. An oscillator according to claim 1 wherein said means for producing a magnetic field comprises a pair of series wound coils disposed on opposite sides of said resonator adapted to produce a unidirectional magnetic field.

References Cited

N. S. Chang et al., "YIG-Tuned Gunn Effect Oscillator," Proc. IEEE (Letters), vol. 55, p. 1621, September 1967.

M. Dydyk, "Ferrimagnetically Tunable Gunn Effect Oscillator," Proc. IEEE (Letters), pp. 1363–64, August 1968.

JOHN KOMINSKI, Primary Examiner

U.S. Cl. X.R.

317—234